(12) United States Patent  
Mendiratta et al.

(10) Patent No.: US 8,968,485 B2
(45) Date of Patent: Mar. 3, 2015

(54) APPARATUS AND METHODS FOR PROCESSING A SUBSTRATE

(75) Inventors: Arjun Mendiratta, Oakland, CA (US); Cheng-Yu Lin, Cupertino, CA (US); David Mui, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 762 days.

(21) Appl. No.: 13/251,064

(22) Filed: Sep. 30, 2011

(65) Prior Publication Data

US 2013/0081655 A1    Apr. 4, 2013

(51) Int. Cl.
*B08B 3/00* (2006.01)
*B08B 1/02* (2006.01)
*B08B 3/04* (2006.01)
*H01L 21/02* (2006.01)
*H01L 21/67* (2006.01)

(52) U.S. Cl.
CPC ... *B08B 1/02* (2013.01); *B08B 3/04* (2013.01); *H01L 21/02065* (2013.01); *H01L 21/02074* (2013.01); *H01L 21/6704* (2013.01); *H01L 21/67051* (2013.01)
USPC ........ 134/56 R; 134/57 R; 134/137; 134/144; 134/151; 134/172

(58) Field of Classification Search
None
See application file for complete search history.

(56) References Cited

U.S. PATENT DOCUMENTS

| | | |
|---|---|---|
| 4,818,326 A | 4/1989 | Liu et al. |
| 6,368,183 B1 | 4/2002 | Trojan et al. |
| 6,505,636 B1 | 1/2003 | Travis |
| 6,568,991 B2 | 5/2003 | Herb et al. |
| 6,857,838 B2 | 2/2005 | Kuroda |
| 7,264,007 B2 | 9/2007 | Boyd et al. |

*Primary Examiner* — Eric Golightly
(74) *Attorney, Agent, or Firm* — Martine Penilla Group, LLP

(57) ABSTRACT

An apparatus for processing a substrate, comprising: a process chamber having a track; a carrier connected to the track; upper and lower proximity heads in the chamber and positioned along the path, the proximity heads having opposing faces that define a gap in which a meniscus of fluid is formed, the path being defined along the gap between the opposing faces; a first pre-wet dispenser and a second pre-wet dispenser disposed along side of the upper proximity head and directed toward the path; a drive for moving each of the pre-wet dispensers between a center position along the length of the upper proximity head and opposite outer positions near outer ends of the upper proximity head; and a pre-wet controller for causing the drive to move each of the first and second pre-wet dispensers based on a position of the carrier when moved under the first and second pre-wet dispensers.

6 Claims, 16 Drawing Sheets

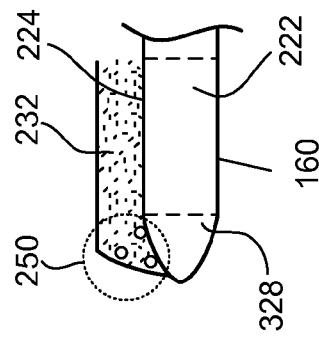
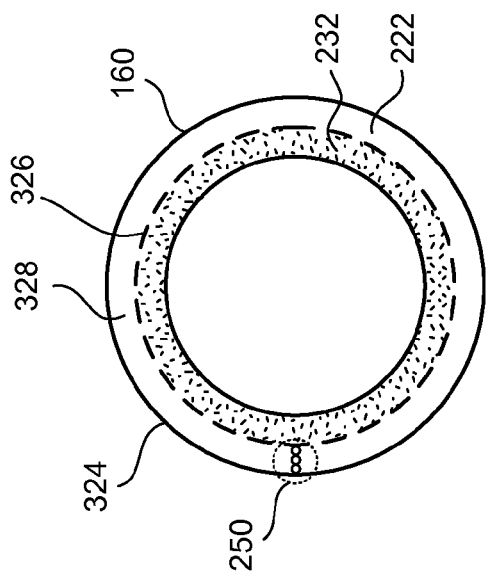
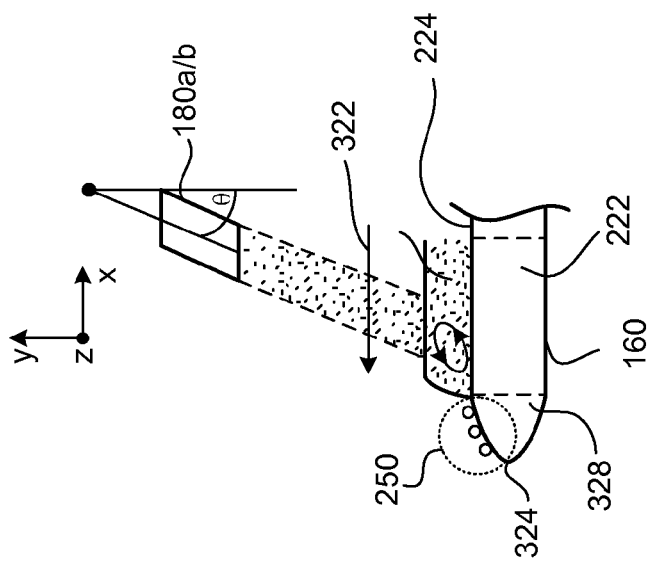
FIG. 10C
FIG. 10B
FIG. 10A

APPARATUS AND METHODS FOR PROCESSING A SUBSTRATE

TECHNICAL FIELD

The various embodiments described herein relate generally to processing a substrate, and more particularly to apparatus and methods for pre-wetting and cleaning the substrate.

BACKGROUND ART

Due to advances in device scaling for semiconductors, semiconductor device features have become smaller at the same time their aspect ratios have become larger. Consequently, semiconductor wafers have become susceptible to damage from residue created as a result of process flows for semiconductor manufacturing.

To address this susceptibility and other problems, a system has been developed that uses mechanical and chemical cleaning to selectively remove the residue from a semiconductor wafer without damage to the wafer's device structures. This system transports a single semiconductor wafer linearly between an opposing pair of proximity heads that deliver a cleaning fluid to the wafer in an exposure time on the order of a few seconds.

A fluid meniscus is created between the two proximity heads. Cleaning is accomplished by passing the wafer through this meniscus. When the wafer first enters the meniscus, a moving contact line is created. Significant forces are generated at this contact line, which can cause any particles that may be on a bevel of a surface of the wafer to be dislodged. These particles can then be redeposited on the surface of the wafer, where they can interfere with subsequent wafer processing steps, ultimately leading to device failure.

SUMMARY

In one embodiment, an apparatus for processing a substrate is described. The apparatus includes a process chamber, which has a track. Moreover, a carrier is connected to the track for moving the substrate along a path. The apparatus further includes upper and lower proximity heads defined in the process chamber and positioned along the path. The upper and lower proximity heads have opposing faces that define a gap in which a meniscus of fluid is formed when in operation. The path for the carrier is defined along the gap between the opposing faces. Also, the upper and lower proximity heads have a length that extends up to at least a diameter of the substrate. The apparatus also includes a first pre-wet dispenser and a second pre-wet dispenser disposed along side of the upper proximity head. The first and second pre-wet dispensers are directed toward the path. The apparatus includes a drive for moving each of the first and second pre-wet dispensers between a center position along the length of the upper proximity head and opposite outer positions defined near outer ends of the upper proximity head. The apparatus further includes a pre-wet controller for causing the drive to move each of the first and second pre-wet dispensers based on a position of the carrier when moved under the first and second pre-wet dispensers.

In another embodiment, an apparatus for processing a substrate is described. The apparatus includes a carrier for carrying a substrate, a position sensor for sensing a position of the substrate, and a pre-wet controller for receiving the position. The apparatus further includes a pre-wet dispenser for dispensing a pre-wetting fluid towards a portion of an edge region of the substrate to form a pre-wetting fluid meniscus. The apparatus also includes upper and lower proximity heads for dispensing a cleaning fluid on the substrate to form a cleaning fluid meniscus in between the upper and lower proximity heads. The carrier is moved in a direction to enable the substrate to come in contact with the pre-wetting fluid before the substrate comes in contact with the cleaning fluid meniscus. The pre-wet controller is used for controlling the pre-wet dispenser based on the position.

In yet another embodiment, a method for processing a substrate is described. The method includes generating a fluid meniscus between upper and lower proximity heads. Each of the upper and lower proximity heads has a length that extends up to at least a diameter of the substrate. The method further includes dispensing a pre-wetting fluid towards an edge region of the substrate to form a pre-wet fluid meniscus on the edge region. The method also includes progressively moving the substrate along a path that is defined between the upper and lower proximity heads to progressively establish contact between the pre-wet fluid meniscus and the fluid meniscus.

The pre-wetting avoids transport of particles from a bevel of the substrate to other areas of a surface of the substrate. Also, the pre-wetting the edge region uses less of the pre-wetting fluid than that used to pre-wet the entire surface. The advantages of the apparatus and various methods, described herein, will become apparent from the following drawings taken in conjunction with the accompanying detailed description.

BRIEF DESCRIPTION OF THE DRAWINGS

FIG. 10A is a view of the substrate dispensed with an edge-directed flow of the pre-wetting fluid, in accordance with an example embodiment of the present invention.

FIG. 10B is a top view of the substrate to illustrate a contact line of a pre-wet meniscus, in accordance with an example embodiment of the present invention.

FIG. 10C is a view of the substrate to illustrate dislodging of particles from the surface, in accordance with an example embodiment of the present invention.

DETAILED DESCRIPTION

In the following description, numerous specific details are set forth in order to provide a thorough understanding of various embodiments of the present invention. However, it will be apparent to one skilled in the art that the present invention may be practiced without some of these specific details. In other instances, known process operations and implementation details have not been described in detail in order to avoid unnecessarily obscuring the invention. The term, "meniscus," as used herein, refers to a volume of liquid bounded and contained in part by surface tension of the liquid. The meniscus is also controllable and can be moved over a surface in the contained shape. In some embodiments, the meniscus is maintained by the delivery of fluids to a surface while also removing the fluids so that the meniscus remains controllable. Furthermore, the meniscus shape can be controlled by precision fluid delivery and removal systems that are in part interfaced with a controller a computing system, which may be networked.

Figure 1:
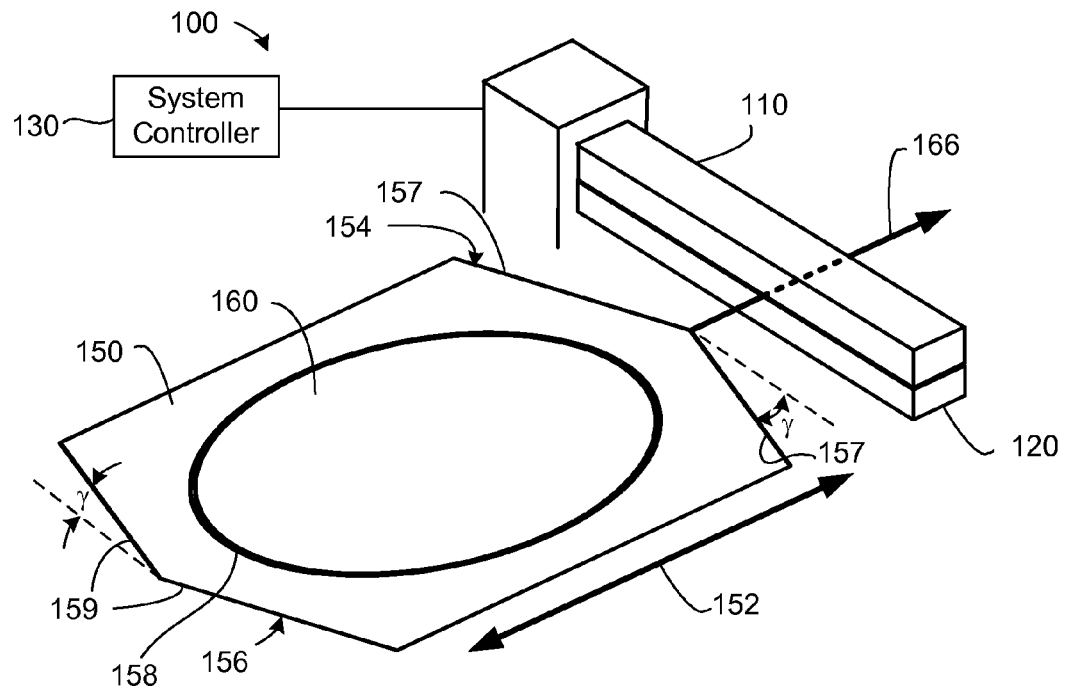
FIG. 1 is a perspective view of a proximity head apparatus, in accordance with an example embodiment of the present invention.

FIG. 1 is a perspective view of an embodiment of a proximity head apparatus 100. In this example, substrate 160 is supported by a carrier 150, which comprises a frame having a central opening sized for receiving substrate 160. Substrate 160 may be a semiconductor wafer. Carrier 150 passes between upper proximity head 110 and lower proximity head 120 in the direction of arrow 166. Upper and lower proximity heads 110, 120, form a meniscus of cleaning fluid between them. Carrier 150 may be connected to some apparatus (not shown) for causing carrier 150 to move between upper and lower proximity heads 110, 120 in the direction of arrow 152. In one embodiment, substrate 160 is placed on carrier 150 at a first location on one side of proximity heads 110, 120, and removed when carrier 150 arrives at a second location on an opposite side of proximity heads 110, 120. Carrier 150 may then pass back through proximity heads 110, 120, or over, under, or around proximity heads 110, 120, back to the first location, where a next substrate is placed, and the process is repeated.

Carrier 150 includes support pins 153 (shown in FIG. 5A), each having substrate support and centering features (not shown), to ensure a uniform carrier-substrate gap 158 between substrate 160 and carrier 150. In one embodiment, carrier 150 has sloped edges at the leading side 154 and trailing side 156 to prevent abrupt changes in the volume of meniscus liquid as carrier 150 enters and exits the meniscus. For example, carrier 150 has six sides with two leading edges 157 each angled from the transverse direction by an angle γ (gamma), and together forming a centrally-located point, and corresponding trailing edges 159 each forming the angle γ and together forming a centrally-located point. Other shapes that do not result in a rapid displacement of meniscus liquid are also possible, such as a trapezoid or parallelogram, wherein leading and trailing edges are at an angle other than a right angle to the direction of travel of the carrier or are at an angle to (i.e., not parallel with) the leading and trailing edges of the meniscus.

It should be noted that, while in the example shown in FIG. 1, the substrate 160 moves through proximity heads 110, 120 in the direction of arrow 166, it is also possible for the substrate to remain stationary while the proximity heads 110, 120, pass over and under the substrate, so long as the substrate moves with respect to the proximity heads. Furthermore, the orientation of the substrate 160 as it passes between the proximity heads 110 and 120 is arbitrary. That is, the substrate 160 is not required to be oriented horizontally, but can instead be vertically oriented or at any angle.

In certain embodiments, a system controller 130 controls the movement of carrier 150 and the flow of cleaning fluids to upper and lower proximity heads 110, 120. It should be noted that "controller" as used herein, may be a general purpose computer, a specific purpose computer, a processor, a microprocessor, a central processing unit (CPU), or combinations thereof. Functionality of the "controller" is determined by logic circuits, software, or both. The "controller" may include or be coupled with a computer-readable medium, which may be a read-only memory (ROM) or a random access memory (RAM). Various examples of the computer-readable medium include a hard disk, a compact disc ROM (CDROM), and a flash memory.

Figure 2:
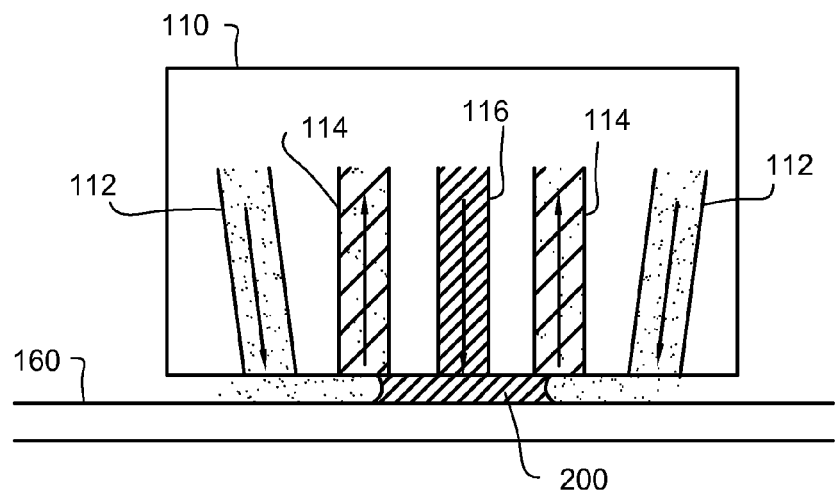
FIG. 2 is a schematic representation of an upper proximity head, in accordance with an example embodiment of the present invention.

FIG. 2 shows a schematic representation of an embodiment of upper proximity head 110, which is a mirror image of lower proximity head 120 (FIG. 1). Each proximity head 110 and 120 includes a plurality of central nozzles 116 through which a cleaning fluid is supplied that forms meniscus 200. The cleaning fluid may be deionized water (DIW), a cleaning solution, or other liquid designed to process, clean, or rinse substrate 160. Multiple vacuum ports 114 facilitate application of a vacuum at a perimeter of meniscus 200. Vacuum ports 114 aspirate the cleaning fluid from a gap between the upper and lower proximity heads 110 and 120. In certain embodiments, nozzles 112 surround vacuum ports 114 and supply a drying fluid, such as, isopropyl alcohol vapor (IPA), nitrogen ($N_2$), a mixture thereof, or other gas or two-phase gas/liquid, to dry the cleaning fluid. The nozzles 112 and drying fluid supplied therefrom aid in maintaining a coherent liquid/gas interface at the surface of meniscus 200. More details relating to proximity head structure and operation can be found in U.S. Pat. Nos. 7,234,477; 7,198,055; and 7,240,679.

Figure 3A:
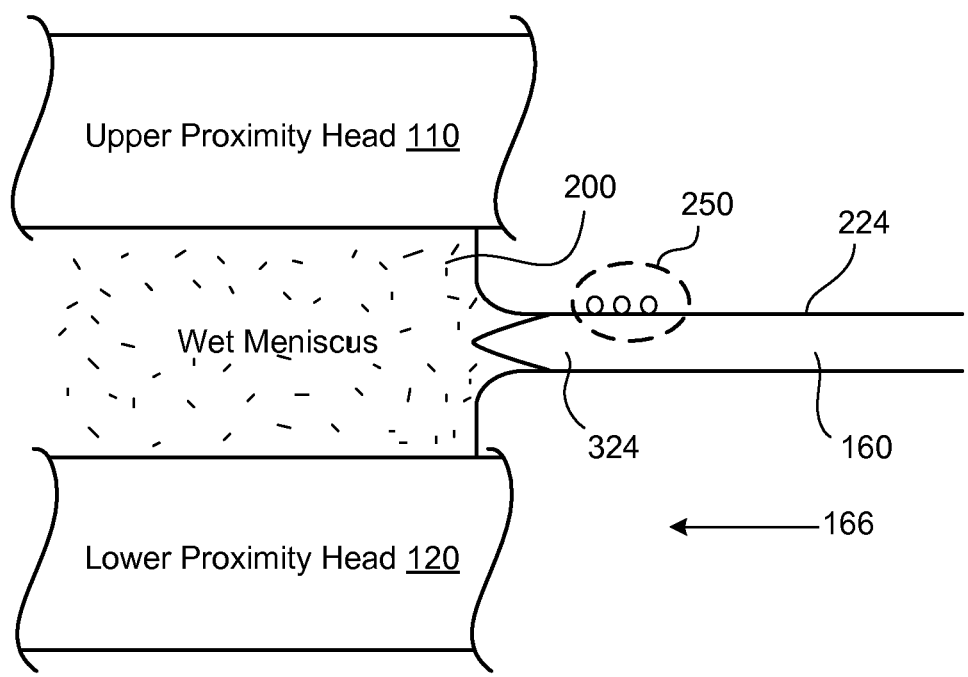
FIG. 3A is a schematic representation of a substrate as the substrate passes between the upper proximity head and a lower proximity head, in accordance with an example embodiment of the present invention.
Figure 3B:
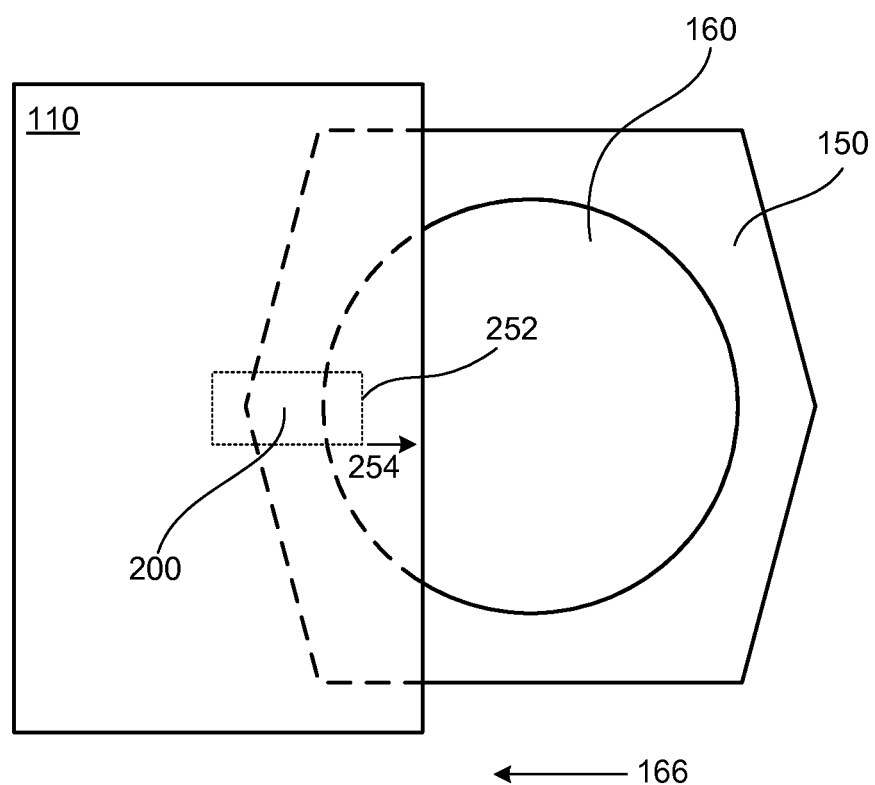
FIG. 3B is another schematic representation of the substrate passing between the upper and lower proximity heads, in accordance with an example embodiment of the present invention.

FIGS. 3A and 3B show schematic representations of substrate 160 as the substrate 160 passes between upper proximity head 110 and lower proximity head 120. Substrate 160 is fabricated using a fabrication operation. Examples of the fabrication operation include plasma etching and chemical mechanical polishing (CMP). In CMP, substrate 160 is placed in a holder which pushes a surface 224 of substrate 160 against a rolling conveyor belt. This conveyor belt uses a slurry which includes chemicals and abrasive materials to cause the polishing. Unfortunately, the fabrication operation tends to leave an accumulation of slurry particles 250 as residues on surface 224. If left on surface 224, the unwanted particles 250 may cause, among other things, defects such as scratches on the substrate 160 and inappropriate interactions between metallization features. In some cases, such defects may cause electronic devices on the substrate 160 to become inoperable. In order to avoid the undue costs of discarding substrate 160 having inoperable devices, it is therefore desirable to clean the surface 224 adequately yet efficiently after the fabrication operation that leave the particles 250.

As the substrate 160 makes contact with meniscus 200, an advancing contact line 252, shown in FIG. 3B, of meniscus 200 moves across the surface 224 exposing the particles 250 to dislodging forces at the contact line 252. The contact line 252 advances in a direction 254 opposite to direction 166. The particles 250 are dislodged at the contact line 252 and re-deposited back onto the surface 224 by re-circulation eddies near the contact line 252. The particles may be dislodged from a bevel 324 of substrate 160 to remaining portion of surface 224.

Figure 4:
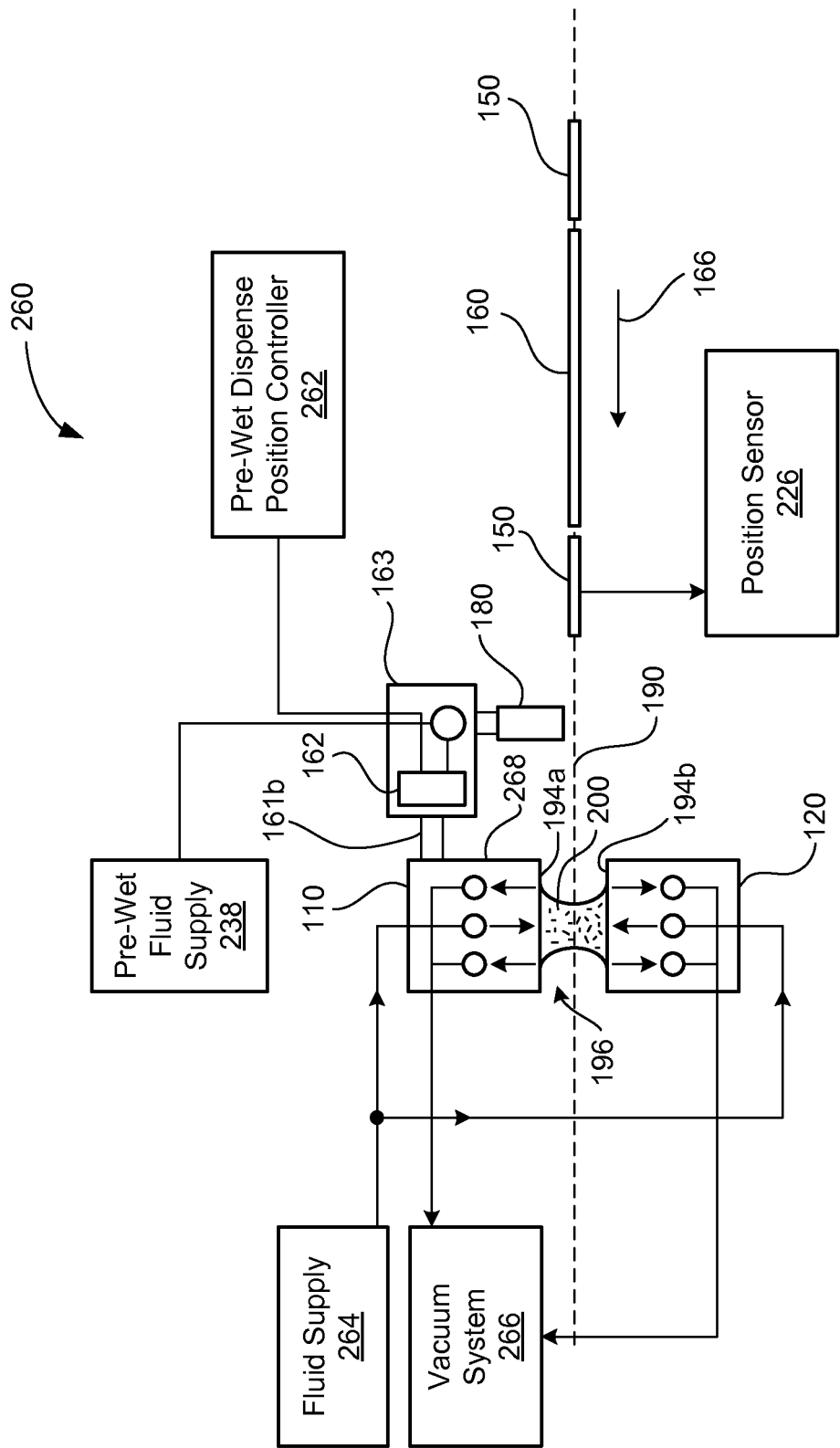
FIG. 4 is a schematic of a pre-wet and proximity head system used to apply a pre-wetting fluid and to clean portions of the substrate, in accordance with an example embodiment of the present invention.

FIG. 4 is a schematic of an embodiment of a pre-wet and proximity head system 260 used to apply a pre-wetting fluid and to clean portions of substrate 160. A position sensor 226, which may be an optical sensor or a Hall effect sensor, senses whether carrier 150 has reached an initial position relative to a position of upper and lower proximity heads 120 as the carrier 150 progresses in direction 166 towards meniscus 200. In some embodiments, position sensor 226 senses whether substrate 160, rather than carrier 150, has reached an initial position relative to a position of upper and lower proximity heads 120 as the substrate 160 progresses in direction 166 towards meniscus 200.

When position sensor 226 determines that carrier 150 has reached the relative initial position, position sensor 226, the position sensor 226 sends a signal to the pre-wet controller 214. Upon receiving the signal, the pre-wet controller 214 sends a signal to a pre-wet dispenser position controller 262 that sends a drive signal to a drive 162. Upon receiving the drive signal, the drive 162 drives pre-wet dispensers 180 that dispense a pre-wetting fluid towards an edge region of substrate 160. In several embodiments, the pre-wetting fluid may be dispensed at a flow rate ranging between 500 milliliters (ml) per minute to 1000 ml per minute. Pre-wet dispensers 180 may be nozzles. The pre-wetting fluid is supplied from a pre-wet fluid supply 238. The pre-wetting fluid may be may be deionized water, a mixture of water and alcohol, a surfactant solution, a solvent, a cleaning solution, or other liquid designed to wet at least a portion of the edge region.

The pre-wet dispensers 180 are disposed along a side 268 of the upper proximity head 110. The pre-wet dispensers 180 are attached to a pre-wet dispenser head 160, which is attached to upper proximity head 110 via an extension 161. The pre-wet dispenser head 160 includes the drive 162.

After the pre-wetting fluid is dispensed on a portion of the edge region, the substrate 160 progresses towards a gap 196 formed between upper face 194a of upper proximity head 110 and lower face 194b of lower proximity head 120. Meniscus 200 is formed within the gap 196. A fluid supply 264 supplies the cleaning fluid used to form the meniscus 200. A vacuum system 266 supplies the vacuum applied to the perimeter of meniscus 200.

It should be noted that in some embodiments, the fluid supply 264 supplies the cleaning fluid to form the meniscus 200 after the pre-wet fluid supply 238 supplies the pre-wetting fluid. However, in other embodiments, the fluid supply 264 supplies the cleaning fluid before the pre-wetting fluid is supplied.

Figure 5A:
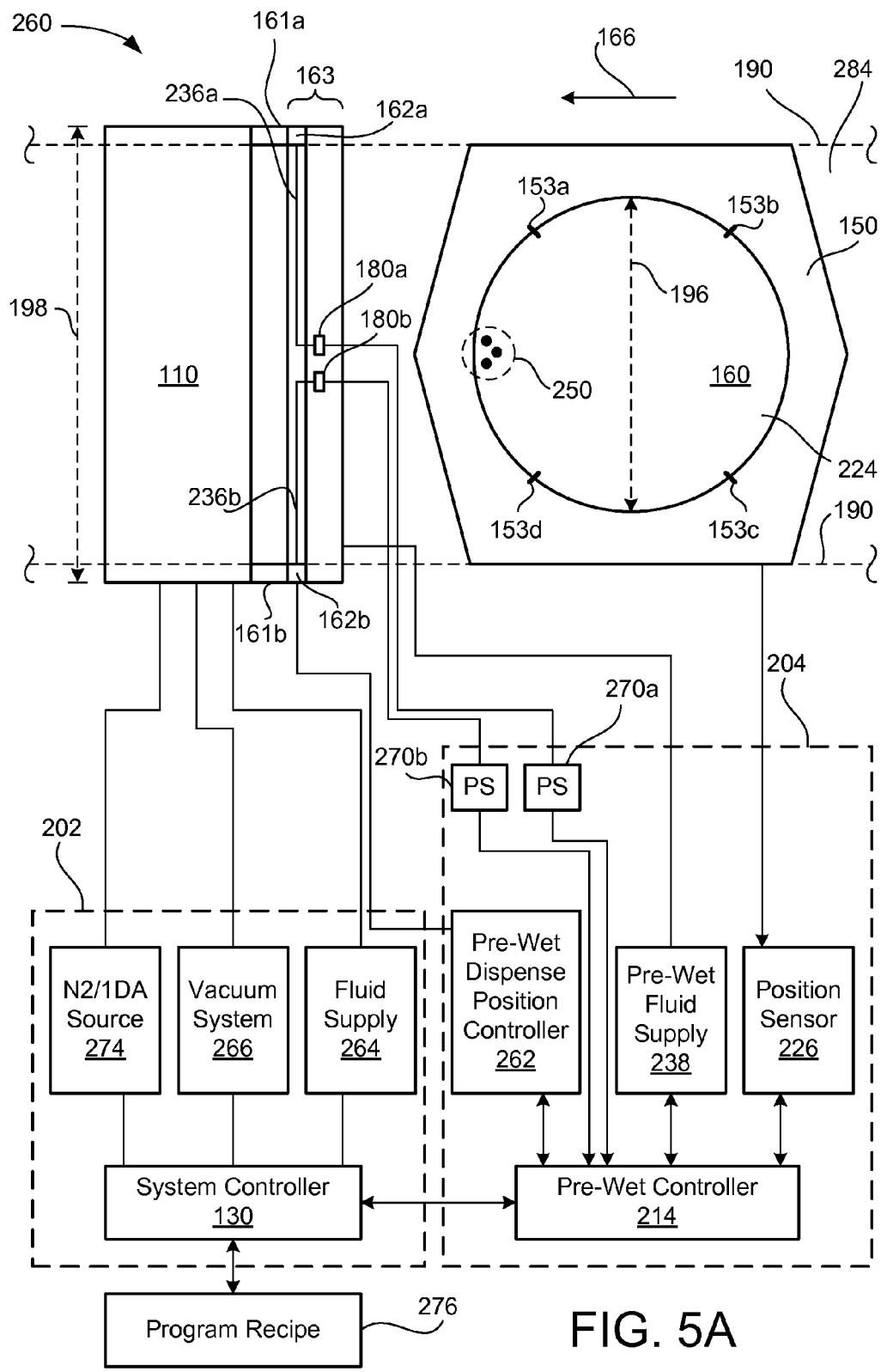
FIG. 5A is a detailed schematic diagram of the pre-wet and proximity head system, in accordance with an example embodiment of the present invention.

FIG. 5A is a detailed schematic diagram of an embodiment of the pre-wet and proximity head system 260. When position sensor 226 senses that carrier 150 has reached the relative position, the position sensor 226 sends a signal to a pre-wet controller 214 to start a pre-wet cycle. The pre-wet controller 214 co-ordinates pre-wetting and cleaning portions of substrate 160. In response to the signal, pre-wet controller 214 sends a signal to pre-wet dispense position controller 262 and another signal to pre-wet fluid supply 238.

Upon receiving the signal from pre-wet controller 214, the pre-wet position controller 262 sends the drive signal. In response to receiving the drive signal, a driver 162a of the drive 162 drives pre-wet dispenser 180a along a guide rail 236a from a center position to an outer position and a driver 162b of the drive 162 drives pre-wet dispenser 180b along a guide rail 236b from the center position to an outer position. It should be noted that although two guide rails 236a and 236b are shown, in various embodiments, a single guide rail can be used and the pre-wet dispensers 180 are driven along the single guide rail. During the drive from the center position to the outer positions, the pre-wetting fluid is dispensed from the pre-wet dispensers 180 towards the edge region. For example, when the signal is received from pre-wet controller 214, a valve within the pre-wet fluid supply 238 may open to enable the pre-wetting fluid to flow to the pre-wet dispensers 180 to dispense the pre-wetting fluid.

A position sensor 270a senses whether pre-wet dispenser 180a has reached the outer position relative to the center position of the pre-wet dispenser 180a. Similarly, position sensor 270b senses whether pre-wet dispenser 180 has reached the outer position relative to the center position. The position sensors 270 may be may be optical sensors or Hall effect sensors, or a combination thereof. The position sensors 270 generate signals upon determining that the outer positions are reached. In response to receiving the signals from the position sensors 270, pre-wet controller 214 sends a signal to pre-wet dispense position controller 262 that sends a signal to pre-wet fluid supply 238 to stop the supply of the pre-wetting fluid. When the signal is received by pre-wet fluid supply 238, the pre-wet fluid supply 238 stops the supply of the pre-wetting fluid. For example, upon receiving the signal, the valve may close. The pre-wet cycle ends when the outer positions are reached. The pre-wet dispense position controller 262, the pre-wet fluid supply 238, the position sensor 226, and the pre-wet controller 214 are part of a pre-wet system 204.

In other embodiments, the position sensors 270 avoid generating signals upon determining that the outer positions are reached. In response to the lack of reception of signals from the position sensor 226, pre-wet controller 214 avoids sending a signal to pre-wet dispense position controller 262 that avoids sending a signal to pre-wet fluid supply 238, which continues to supply the pre-wetting fluid. The position sensors 270 sense that the pre-wet dispensers 180 have reached the center position from the outer positions and send a signal to the pre-wet controller 214. In response to receiving the signal, the pre-wet controller 214 sends a signal to signal to pre-wet dispense position controller 262 that further sends a signal to the pre-wet fluid supply 238 to stop supplying the pre-wetting fluid. Upon receiving the signal, the pre-wet fluid supply 238 ceases to supply the pre-wetting fluid and the pre-wet dispensers 180 stop dispensing the pre-wetting fluid.

At any time during the pre-wet cycle, pre-wet controller 214 sends a signal to system controller 130 to start a cleaning cycle. For example, the pre-wet controller 214 sends the signal to system controller 130 a time period after receiving the signal from position sensor 226 indicating the start of the pre-wet cycle. In some embodiments, pre-wet controller 214 sends the signal to system controller 130 to start the cleaning cycle after the pre-wet cycle ends.

Upon receiving the signal from pre-wet controller 214, the system controller 130 sends signals to fluid supply 264, vacuum system 266, and an $N_2$/IPA source 274. Moreover, upon receiving the signal, the fluid supply 264 supplies the cleaning fluid to the nozzles of the upper proximity head 110 and/or lower proximity head 120. Moreover, upon receiving the signal, the $N_2$/IPA source 274 supplies the drying fluid to dry the cleaning fluid. Also, upon receiving the signal, vacuum system 266 supplies vacuum to the gap 196 to aspirate the cleaning fluid and particles 250 from the gap 196. System controller 130 is programmed with a program recipe 276 that allows the system controller 130 to perform its functions. The system controller 130, the $N_2$/IPA source 274, the vacuum system 266, and the fluid supply 204 are part of a proximity head system 202.

It should be noted that a diameter 196 of substrate 160 is less than a length 198 of upper and proximity heads 110 and 120. In some embodiments, diameter 196 is equal to length 198.

Figure 5B:
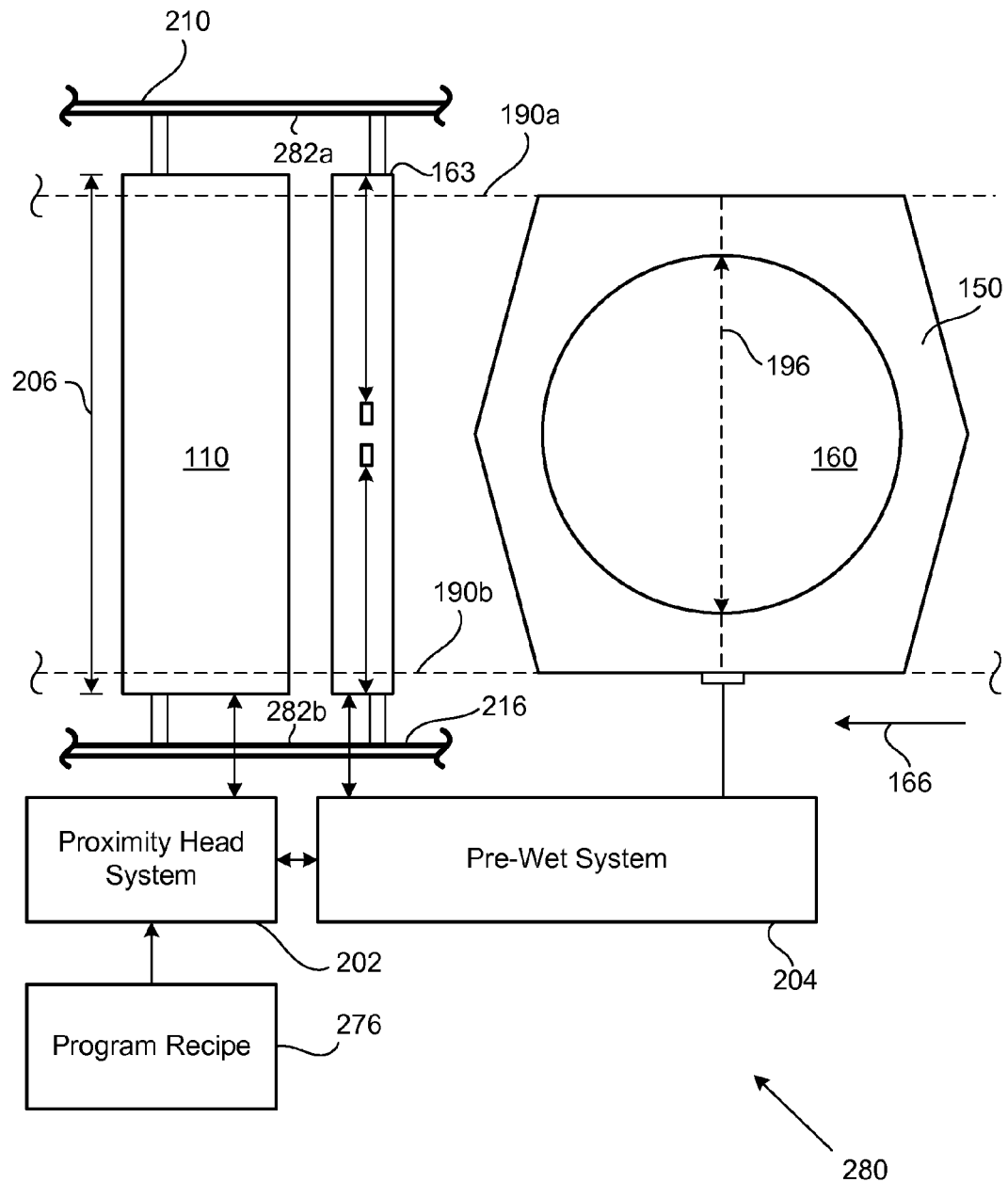
FIG. 5B is a schematic of another pre-wet and proximity head system in which a pre-wet head is attached to inside walls of a process chamber, in accordance with an example embodiment of the present invention.

FIG. 5B is a schematic of an embodiment of a pre-wet and proximity head system 280 in which the pre-wet head 163 is attached to inside walls 282a and 282b of a process chamber 210. Instead of being attached to upper proximity head 110, the pre-wet head 163 is attached to the inside walls 282. The upper and lower proximity heads 110 and 120 and the pre-wet head 163 are situated within processor chamber 210. A path 284 is formed between tracks 190a and 190b. The pre-wet dispensers 180 point in a direction towards the path 284.

Figure 6:
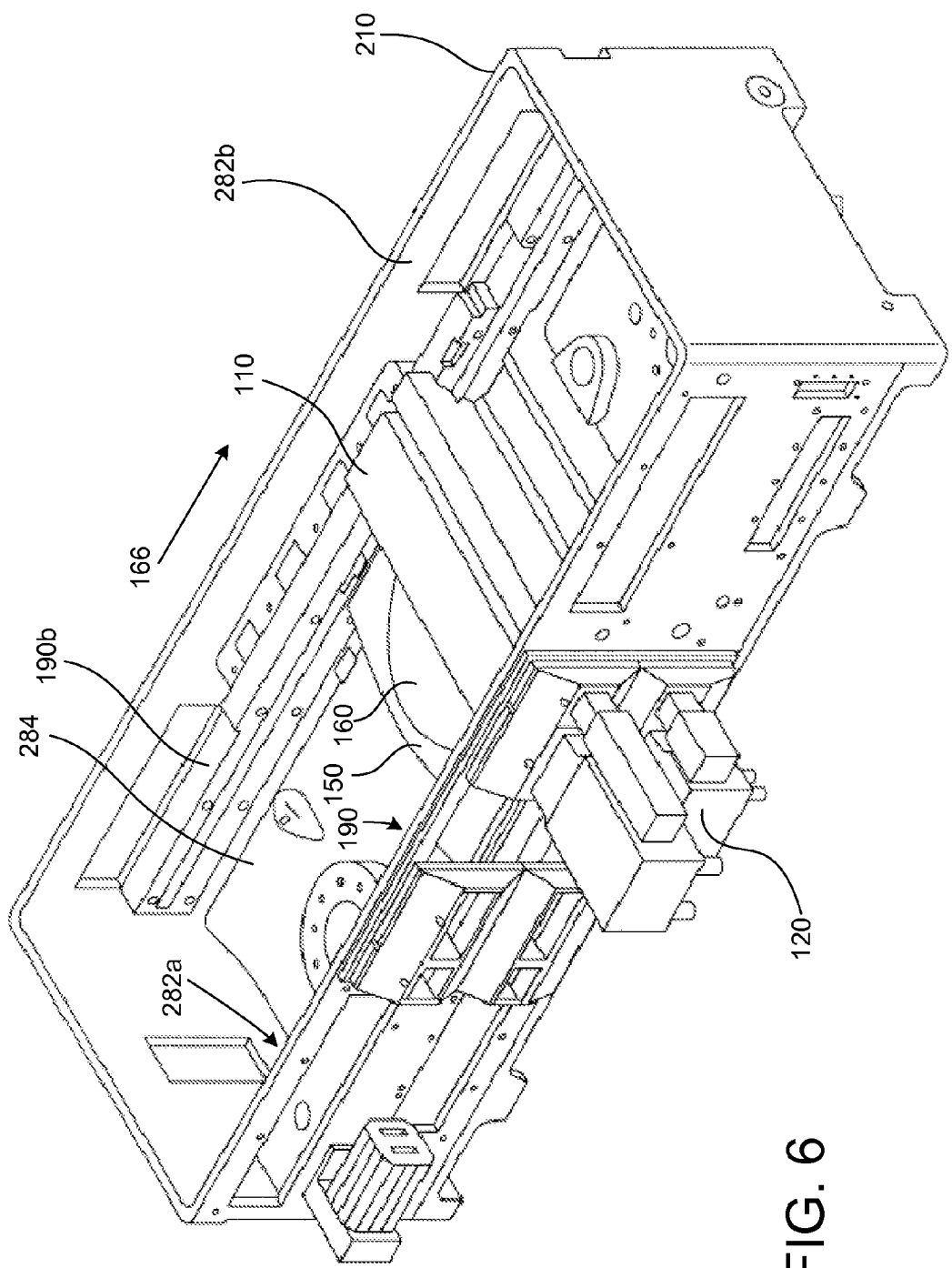
FIG. 6 is an isometric view of the process chamber, in accordance with an example embodiment of the present invention.

FIG. 6 is an isometric view of an embodiment of the process chamber 210. The process chamber 210 has tracks 190a and 190b, although the track 190b is not visible. Carrier 160 moves linearly on tracks 190 in direction 166 along path 284, which is along gap 196. Also, the upper and lower proximity heads 110 and 120 are located along path 284. For example, the length 206 is parallel to path 284.

Figure 7:
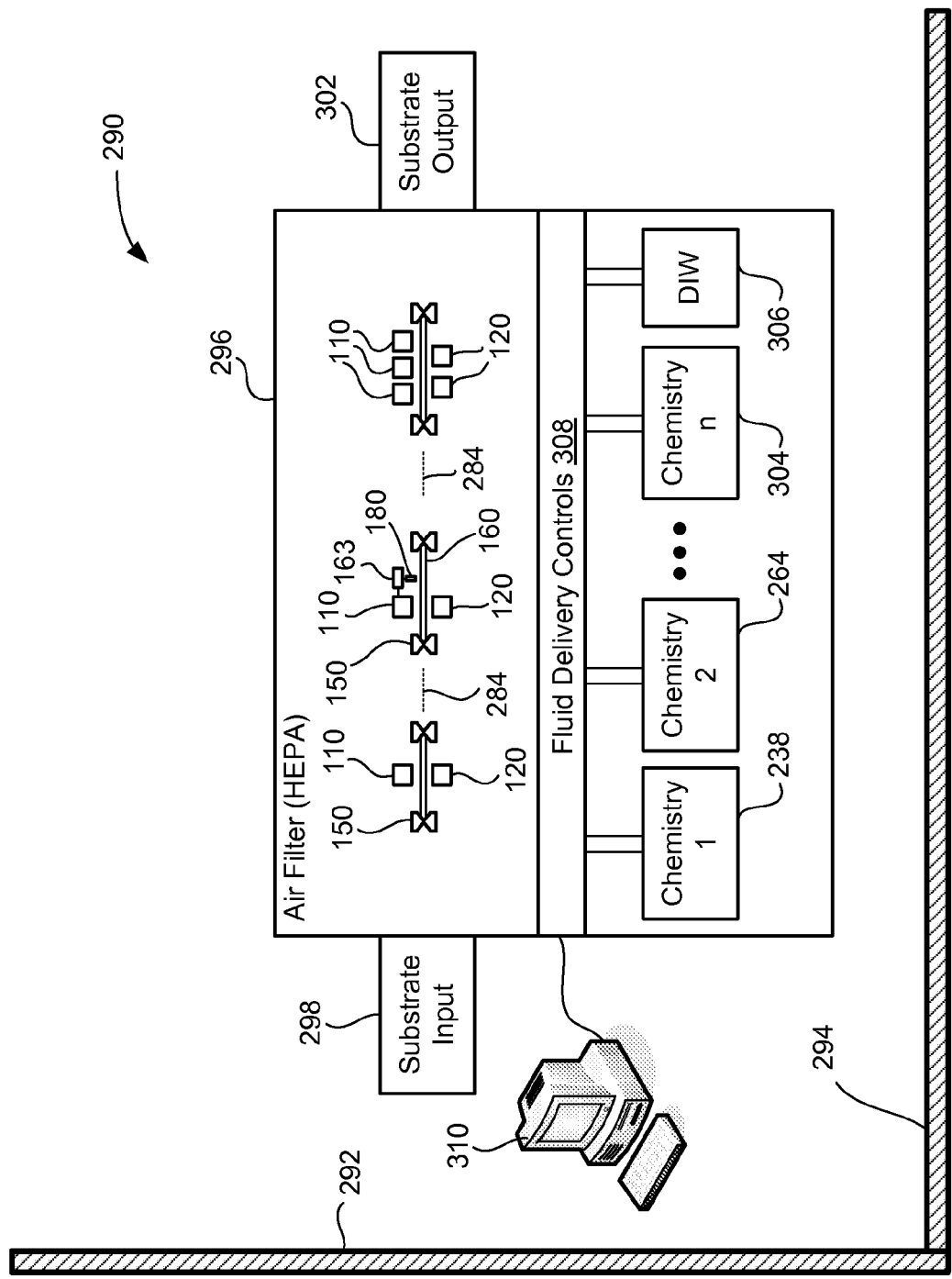
FIG. 7 is a cross-section view of a system within a clean room employing the pre-wet head and the proximity heads, in accordance with an example embodiment of the present invention.

FIG. 7 illustrates a cross-section view of an embodiment of a system 290 within a clean room employing the pre-wet head 163 and proximity heads 110 and 120. A wall 292 and floor 294 of the clean room are shown. The system 290 includes a housing chamber 296, within which multiple proximity heads 110 and 120 are located. The proximity heads 110 and 120 are positioned on opposite sides of path 284 through which substrate 100 moves in the housing chamber 296. Variations of the number and position of proximity heads 110 and 120 can be employed. For example, dual proximity heads, three proximity heads and five proximity heads, located on either side of path 284. The substrate 160 is introduced into the housing chamber 296 through a substrate input region 298 and is removed via a substrate output region 302. The carrier 150 positioned on the path 284 aids in receiving the substrate 160 through the substrate input region 298, transporting the substrate 150 across the system 290 through the proximity heads 110 and 120 and delivering the substrate 150 at the substrate output region 302. The system 290 also includes fluid supplies 238, 264, 304, and 306 to contain a plurality of fluids, such as, chemistries, which are used in facilitating removal of particles 250. In one embodiment, the system 290 is used to apply 1) DIW to lightly clean the substrate 160, 2) light Hydrofluoric acid to remove minor contaminants, and 3) fluids to facilitate removal of particles 250. In other embodiments of the invention, the system 290 may be used to apply 1 and 3 alone or just 3.

The fluids are applied to the substrate 100 in a controlled manner, based on a plurality of process parameters of particles 250 to be removed using a fluid delivery control mechanism 308. A computer 310 running a software may be communicatively connected to the fluid delivery control mechanism 308 to adjust the controls within the fluid delivery control mechanism 620 so that the fluids may be applied to the substrate 160 in a controlled manner. Although the computer 310 is shown to be located within the clean room, the computer 310 can be positioned anywhere outside the clean room and communicatively connected to the fluid delivery control mechanism 308.

Figure 8A:
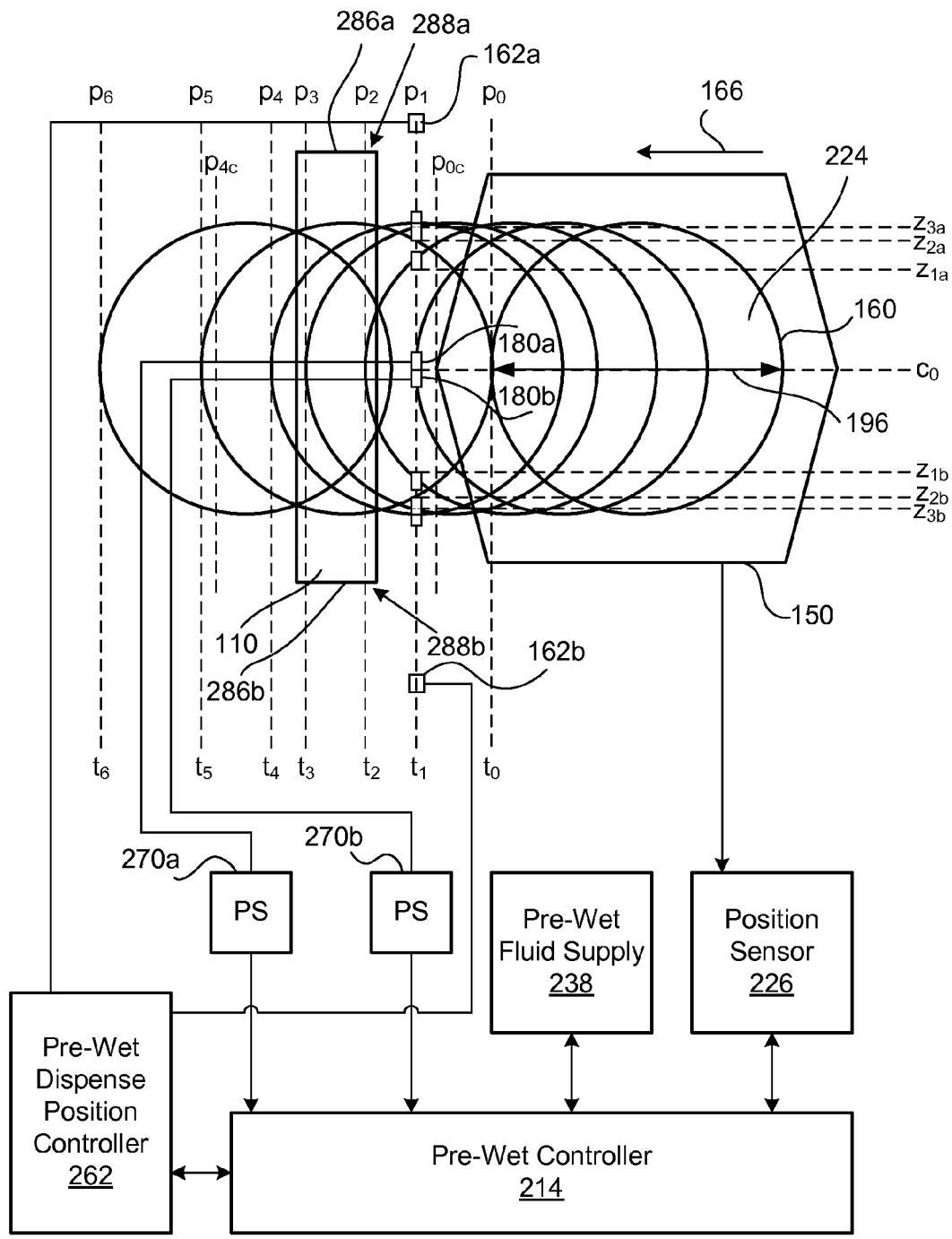
FIG. 8A is a top view the substrate as the substrate passes under pre-wet dispensers, in accordance with an example embodiment of the present invention.

FIG. 8A is a top view of an embodiment of substrate 160 as the substrate 160 passes under pre-wet dispensers 180. At time $t_0$, substrate 160 is at a distance from pre-wet dispensers 180 that are at or about a center position $c_0$. The center position $c_0$ is a position through which the diameter 196 passes. When the substrate 160 is at the distance, the substrate 160 is at a position $p_0$. Moreover, at time $t_0$, the position sensor 226 determines that the relative initial position is yet to be reached and avoids sending a signal to pre-wet controller 214.

The substrate 160 continues to moves in direction 166 towards pre-wet dispensers 180 between time $t_0$ and $t_1$. Thereafter, at time $t_1$, when substrate 160 is closer to pre-wet dispensers 180 than at time $t_0$, the distance from pre-wet dispensers 180 reduces to nil. Also, at time $t_1$, the substrate 160 may be at a position $p_1$, which is directly underneath pre-wet dispensers 180. At time $t_1$, the position sensor 226 determines that the relative initial position is reached. Pre-wet controller 214 receives a signal from the position sensor 226 indicating that the relative initial position is reached, sends a signal to move pre-wet dispenser 180a linearly from center position $c_0$ to an intermediate position $z_{1a}$, and sends a control signal to move pre-wet dispenser 180b linearly from center position $c_0$ to another intermediate position $z_{1b}$. As pre-wet dispensers 180 move to positions $z_{1a}$ and $z_{1b}$, a portion of an edge region of substrate 160 may contact meniscus 200.

Between times $t_1$ and $t_2$, the pre-wet dispenser 180a moves from position $c_0$ to the position $z_{1a}$ and pre-wet dispenser 180b moves from position $c_0$ to the position $z_{1b}$. At time $t_2$, the pre-wet dispenser 180a is at position $z_{1a}$ and the pre-wet dispenser 180b is at position $z_{2a}$. Also, between times $t_1$ and $t_2$, the pre-wetting fluid dispensed from pre-wet dispenser 180a wets a portion of the edge region between positions $c_0$ and $z_{1a}$ and the pre-wetting fluid dispensed from pre-wet dispenser 180b wets a portion of the edge region between positions $c_0$ and $z1b$ to form a pre-wet meniscus on substrate 160.

At time t2, the substrate 160 is at a position $p_2$ and a portion of the pre-wet meniscus may be in contact with the meniscus 200. Furthermore, at time $t_2$, pre-wet controller 214 controls to move pre-wet dispenser 180a from the position $z_{1a}$ to a position $z_{2a}$ and pre-wet controller 214 controls to move pre-wet dispenser 180b from the position $z_{1b}$ to a position $z_{2b}$. Between times t2 and t3, the pre-wetting fluid dispensed from pre-wet dispenser 180a wets a portion of the edge region between positions $z_{1a}$ and $z_{2a}$ and the pre-wetting fluid dispensed from pre-wet dispenser 180b wets a portion of the edge region between positions $z_{1b}$ and $z_{2b}$.

At time t3, the substrate 160 is at a position $p_3$ and a portion of the pre-wet meniscus is in contact with the meniscus 200. Moreover, at time $t_3$, the pre-wet dispenser 180a is at the position $z_{2a}$ and the pre-wet dispenser 180b is at the position $z_{2b}$. Moreover, at time $t_3$, the pre-wet controller 214 controls the pre-wet dispensers 180 to continue to move.

Between times $t_3$ and $t_4$, the pre-wet dispenser 180a moves from the position $z_{2a}$ to an outer position $z_{1a}$ and the pre-wet dispenser 180b moves from the position $z_{2b}$ to an outer position $z_{3b}$. Also, between times $t_3$ and $t_4$, the pre-wetting fluid dispensed from pre-wet dispenser 180a wets a portion of the edge region between positions $z_{2a}$ and $z_{1a}$ and the pre-wetting fluid dispensed from pre-wet dispenser 180b wets a portion of the edge region between positions $z_{2b}$ and $z_{3b}$.

At time $t_4$, the substrate 160 is at a position p4 and a portion of the pre-wet meniscus is in contact with the meniscus 200. Moreover, at time $t_4$, the pre-wet dispenser 180a is at the outer position $z_{1a}$ and the pre-wet dispenser 180b is at the outer position $z_{3b}$. Also, at time $t_4$, the pre-wet dispensers 180 have dispensed the pre-wetting fluid on top of half of the edge region.

When the substrate 160 reaches the position $p_4$, the position sensors 270 sends a signal to pre-wet controller 214 indicating that the outer positions $z_{1a}$ and $z_{3b}$ are reached. In response to receiving the signal indicating that the outer positions $z_{1a}$ and $z_{3b}$ are reached, the pre-wet controller 214 sends a signal to pre-wet fluid supply 238 to stop the dispense of the pre-wetting fluid. In addition, in response to receiving the signal indicating that the outer positions $z_{1a}$ and $z_{3b}$ are reached, the pre-wet controller 214 sends a signal to pre-wet dispense position controller 262 to avoid sending a signal to drive 162. In response to the lack of reception of signal from pre-wet dispense position controller 262, the drive 162 stops driving the pre-wet dispensers 180 that are at outer positions $z_{3a}$ and $z_{3b}$.

In various embodiments, at time $t_4$, the pre-wet controller 214 may determine to continue to move the pre-wet dispensers 180 in a direction opposition to a direction of the movement from the positions $z_{2a}$ and $z_{2b}$ to the respective outer positions $z_{3a}$ and $z_{3b}$.

In these embodiments, between times $t_4$ and $t_5$, the pre-wet dispenser 180a moves from the outer position $z_{3a}$ to the position $z_{2b}$ and the pre-wet dispenser 180b moves from the outer position $z_{3b}$ to the position $z_{2b}$. Also, between times $t_4$ and $t_5$, the pre-wetting fluid dispensed from pre-wet dispenser 180a conditions a portion of the edge region between positions $z_{3a}$ and $z_{2a}$ and the pre-wetting fluid dispensed from pre-wet dispenser 180b conditions a portion of the edge region between outer positions $z_{3b}$ and $z_{2b}$. It should be noted that the conditioning is different than pre-wetting. For example, the pre-wet controller 214 may control the pre-wet dispensers 180 to allow a lesser amount of the pre-wetting fluid to flow to perform the conditioning than that allowed to flow to perform the pre-wetting.

Moreover, in such embodiments, at time $t_5$, the substrate 160 is at a position $p_5$ and a portion of the pre-wet meniscus is in contact with the meniscus 200. Moreover, at time $t_5$, the pre-wet dispenser 180a is at the position $z_{2a}$ and the pre-wet dispenser 180b is at the position $z_{2b}$. At time $t_5$, the pre-wet controller 214 may determine to continue to move the pre-wet dispensers 180 in a direction opposition to a direction of the movement from the center position $c_0$ to the respective positions $z_{2a}$ and $z_{2b}$.

Also, in these embodiments, between times $t_5$ and $t_6$, the pre-wet dispenser 180a moves from the position $z_{2a}$ to the center position $c_0$ and the pre-wet dispenser 180b moves from the position $z_{2b}$ to the center position $c_0$. Also, between times $t_5$ and $t_6$, the pre-wetting fluid dispensed from pre-wet dispenser 180a conditions a portion of the edge region between positions $z_{2a}$ and $c_0$ and the pre-wetting fluid dispensed from pre-wet dispenser 180b conditions a portion of the edge region between positions $z_{2b}$ and $c_0$.

In these embodiments, at time $t_6$, the substrate 160 is at a position $p_6$ and a portion of the pre-wet meniscus lacks contact with the meniscus 200. Moreover, at time $t_6$, the pre-wet dispensers 180 are at the center position $c_0$. At time $t_6$, the pre-wetting fluid is dispensed on the entire edge region. Moreover, in response to receiving a signal from positions sensor 270 indicating that the center position $c_0$ is reached, the pre-wet controller 214 sends a signal to pre-wet dispense position controller 262 to prevent sending a signal to drive 162. In response to the lack of reception of signal from pre-wet dispense position controller 262, the drive 162 stops driving the pre-wet dispensers 180 that are at the center position $c_0$. The portions of the edge region conditioned during the movement of the pre-wet dispensers 180 from the center position $c_0$ to outer positions $z_{3a}$ and $z_{3b}$ is different than and oppositely situated on surface 224 from the portions of the edge region wetted during the movement from the outer positions $z_{3a}$ and $z_{3b}$ to center position $c_0$.

In one embodiment, the movement of pre-wet dispensers 180 is synchronized with the movement of the carrier 150. For example, the movement of the pre-wet dispensers 180 from the center position $c_0$ to the outer positions $z_{3a}$ and $z_{3b}$ is at the same rate as that of movement of the carrier 150 from a position $p_0$, to a position $p_{4c}$. Carrier 150 is at the position $p_0$, at time $t_0$ when the substrate 160 is at the position $p_0$ and the carrier 150 is at the position $p_{4c}$ at time $t_4$ when the substrate 160 is at the position $p_4$. As another example, the movement of the pre-wet dispensers 180 from the outer positions $z_{3a}$ and $z_{3b}$ to the center position $c_0$ is at the same rate as that of movement of the carrier 150 from the position $p_{4c}$ to the position $p_{0c}$. The rate is provided by the pre-wet controller 214 to the pre-wet dispenser position controller 262 to control the rate.

It should be noted that the outer positions $z_{3a}$ and $z_{3b}$ are closer to outer ends 286a and 286b of upper proximity head 110 and to outer ends 288a and 288b of lower proximity head 120 compared to positions $z_{2a}$, $z_{2b}$, $z_{1a}$, $z_{2b}$, and $c_0$. Also, the outer ends 288a and 288b are aligned with the corresponding outer ends 286a and 286b. It should further be noted that although positions $p_{1c}$, $p_{2c}$, $p_{3c}$, $p_{5c}$, and $p_{6c}$ are not shown in FIG. 8A, one of ordinary skill in the art envisions that the carrier 150 is at the position $p_{1c}$ at time $t_1$ when the substrate 160 is at the position $p_1$, the carrier 150 is at the position $p_{2c}$ at time $t_2$ when the substrate 160 is at the position $p_2$, and the carrier 150 is at the position $p_{3c}$ at time $t_3$ when the substrate 160 is at the position $p_3$, the carrier 150 is at the position $p_{5c}$ at time $t_5$ when the substrate 160 is at the position $p_5$, and the carrier 150 is at the position $p_{0c}$ at time $t_6$ when the substrate 160 is at the position $p_6$.

Figure 8B:
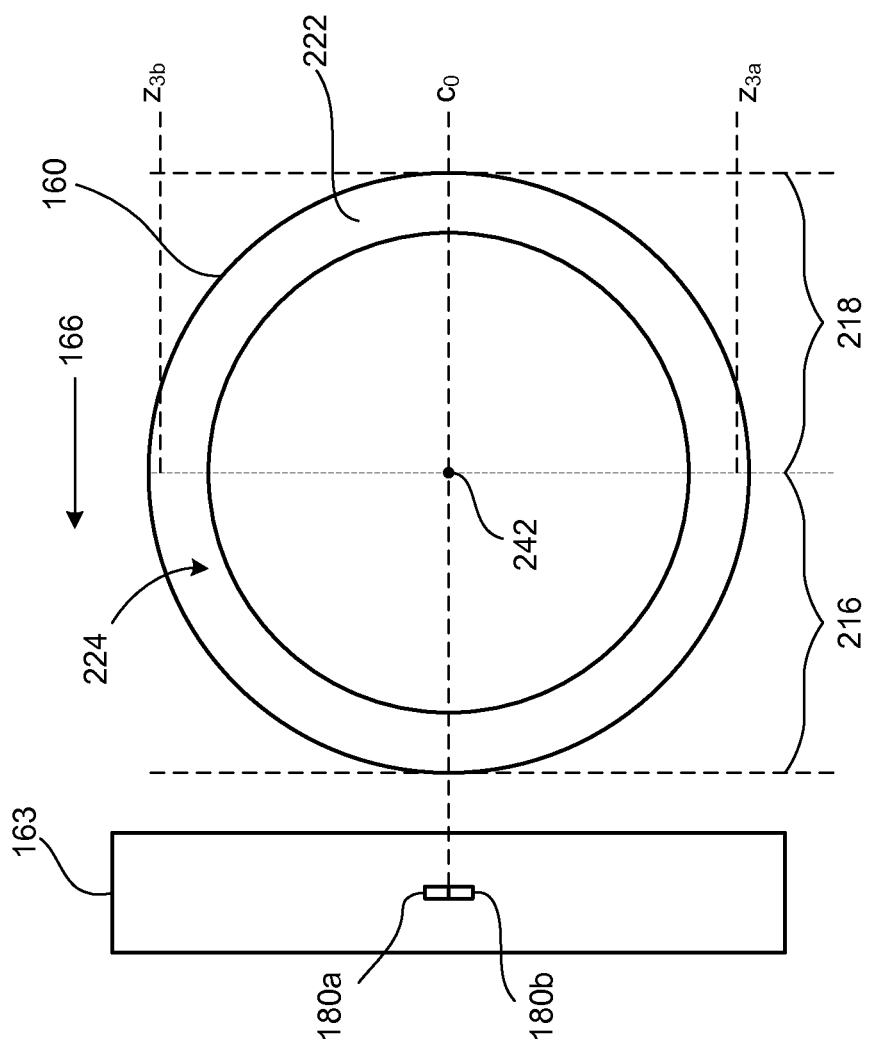
FIG. 8B is a top view of an edge region of a surface of the substrate, in accordance with an example embodiment of the present invention.

FIG. 8B is a top view of an embodiment of an edge region 222 of surface 224. Substrate 160 is divided into two half portions 216 and 222 extending from a center 242 of substrate. The center position $c_0$ is aligned with the center 242. As substrate 160 moves in the direction 166 towards the pre-wet head 163, the pre-wet dispensers 180 move from the center position $c_0$ to the outer positions $z_{3a}$ and $z_{3b}$ to wet the edge region 222 in the half portion 216 first. As substrate 160 moves further in the direction 166 towards the pre-wet head 163 after the portion 216 is wet, the pre-wet dispensers 180 move from the outer positions $z_{3a}$ and $z_{3b}$ to the center position $c_0$ to condition the edge region 222 in the half portion 218. In some embodiments, the pre-wet dispensers 180 avoid conditioning the edge region 222 in the half portion 218 and wet only the edge region 222 in half portion 216.

Figure 8C:
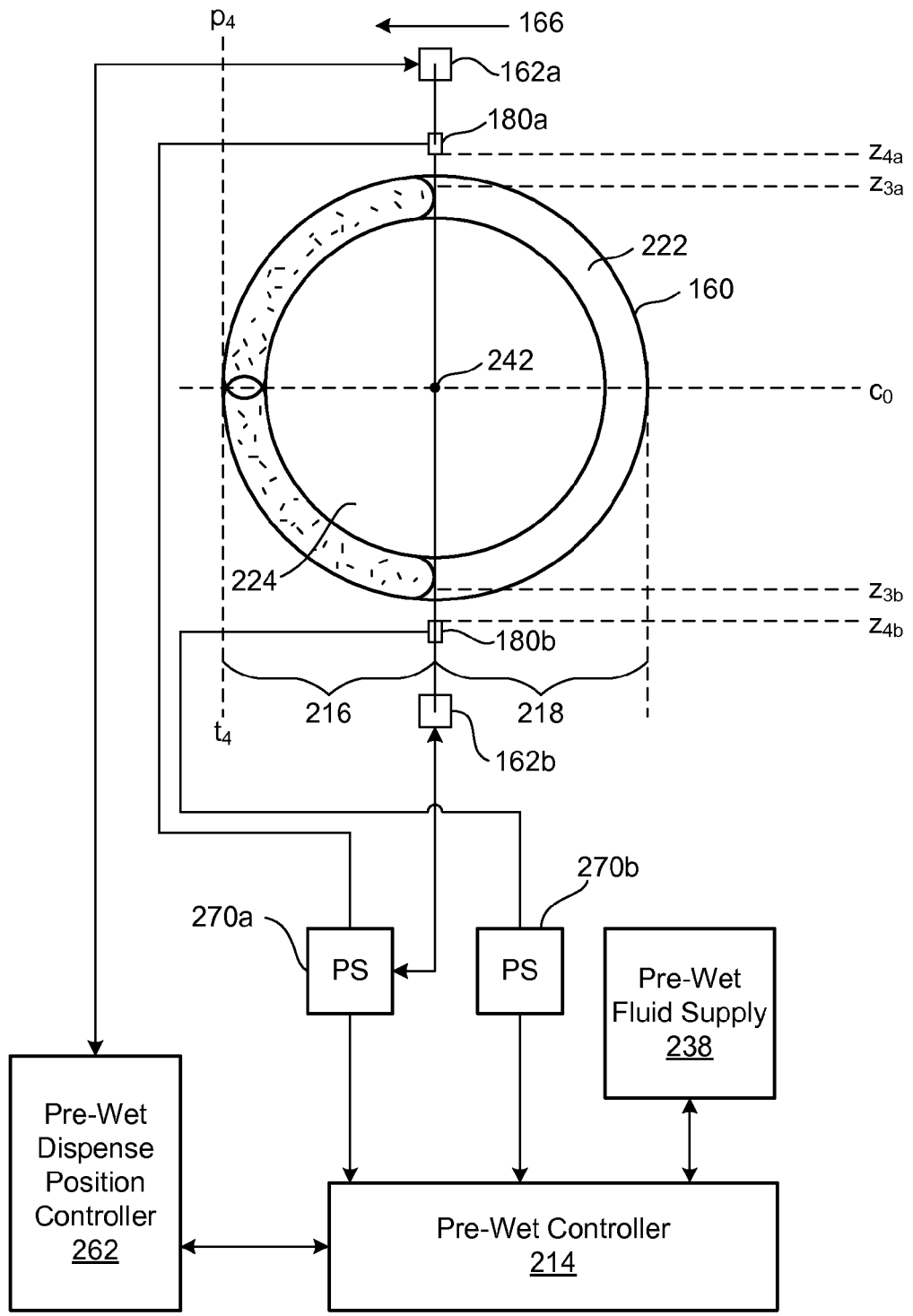
FIG. 8C is a top view of the substrate used to illustrate a movement of the pre-wet dispensers from a center position to positions not on top of the substrate, in accordance with an example embodiment of the present invention.

FIG. 8C is a top view of an embodiment of substrate 160 used to illustrate a movement of pre-wet dispensers 180 from the position $c_0$ to outer positions $z_{4a}$ and $z_{4b}$, which are not on top of substrate 180a. As shown in the figure, the arrows within substrate 160 indicate a direction of dispensing of the pre-wetting fluid from the pre-wet dispensers 180 on the edge region 222 of portion 216. At time $t_4$ when the substrate 160 reaches the position $p_4$, the pre-wet controller 214 controls to move the pre-wet dispenser 180a from the position $z_{3a}$ to the position $z_{4a}$ and to move the pre-wet dispenser 180b from the outer position $z_{3b}$ to the outer position $z_{4b}$ rather than controlling to hold the pre-wet dispensers 180 at respective outer positions $z_{3a}$ and $z_{3b}$. These slight moves to positions $z_{4a}$ and $z_{4b}$ from the respective outer positions $z_{3a}$ and $z_{3b}$ prevent any residual portion of the pre-wetting fluid from dripping on edge region. Also, the slight moves may happen after time $t_4$.

The pre-wet controller 214 controls the pre-wet fluid supply 238 to supply the pre-wetting fluid until the pre-wet dispensers 180 reach the outer positions $z_{4a}$ and $z_{4b}$ rather than the outer positions $z_{3a}$ and $z_{3b}$. For example, the position sensors 270 send a signal to the pre-wet controller 214 that the pre-wet dispensers 180 have reached the outer positions $z_{4a}$ and $z_{4b}$. In response to receiving the signal, the pre-wet controller 214 controls to shut off the supply of the pre-wetting fluid.

Figure 8D:
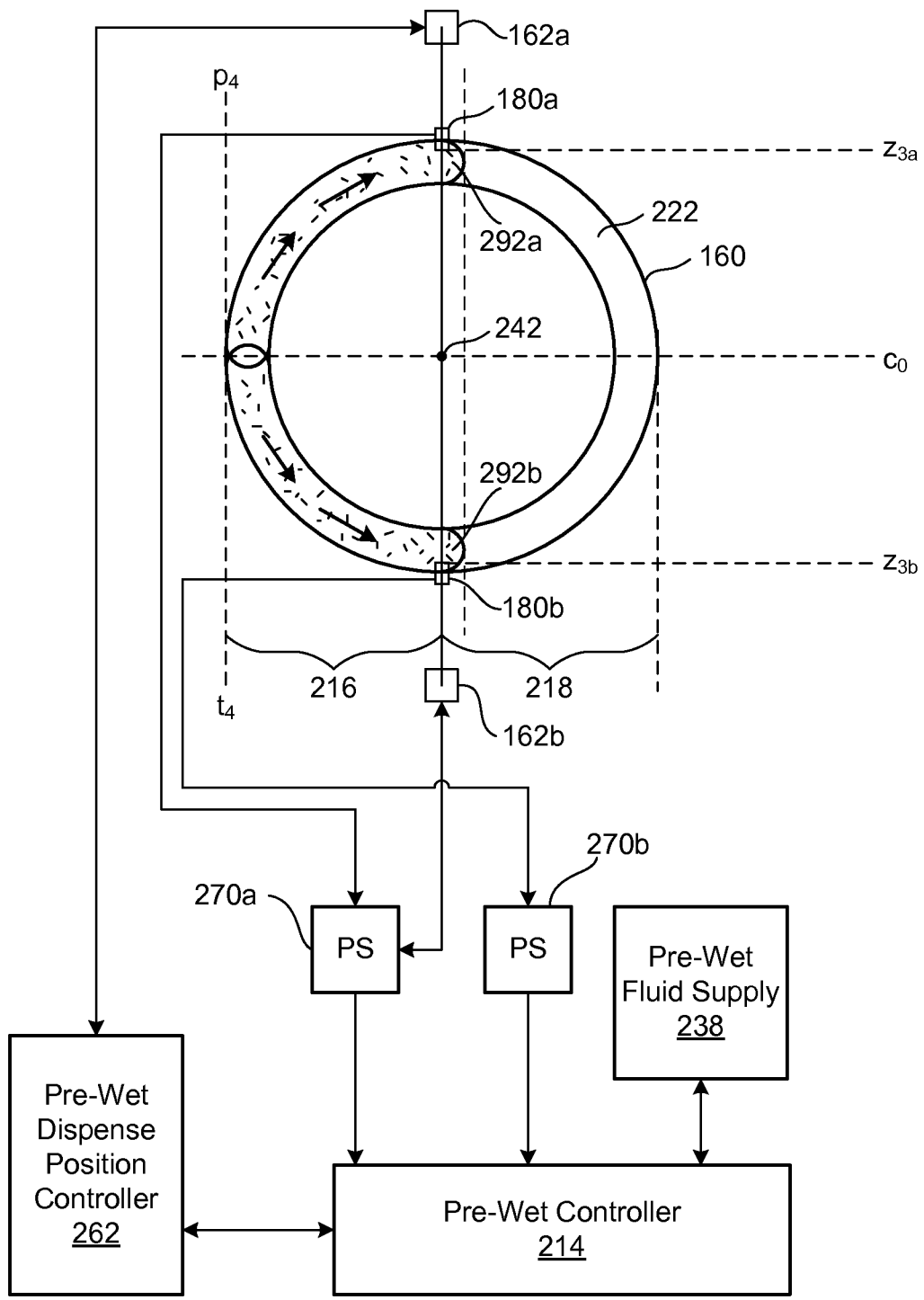
FIG. 8D is a top view of the substrate to illustrate dispensing of the pre-wetting fluid over a first half-annular portion of the edge region and sub-portions of a second half-annular portion of the edge region as the pre-wet dispensers move from the center position to respective outer positions, in accordance with an example embodiment of the present invention.

FIG. 8D shows a top view of an embodiment of substrate 160 to illustrate dispensing of the pre-wetting fluid over edge region 222 of portion 216 and sub-portions 292 of edge region 222 of portion 218 as the pre-wet dispensers 180 move from the center position $c_0$ to respective outer positions $z_{3a}$ and $z_{3b}$. When the pre-wet dispensers 180 move to outer positions $z_{3a}$ and $z_{3b}$, as described in detail below, the pre-wet controller 214 controls a pre-wet dispense angle controller to change an angle of the pre-wet dispensers 180. The change in the angle allows the pre-wetting fluid to dispense the pre-wetting fluid over the sub-portions 292.

The pre-wet controller 214 controls the pre-wet fluid supply 238 to supply the pre-wetting fluid until the pre-wet dispensers 180 reach the positions $z_{3a}$ and $z_{3b}$ and dispense the pre-wetting fluid over the sub-portions 292 rather than until only reaching the positions z3a and z3b. For example, multiple position sensors, including the position sensors 270 and position sensor 310 (shown below in FIG. 9A), send a signal to the pre-wet controller 214 that the pre-wet dispensers 180 have reached the positions $z_{3a}$ and $z_{3b}$ and have performed the angular changes to dispense over the sub-portions 292. In response to receiving the signal, the pre-wet controller 214 controls to shut off the supply of the pre-wetting fluid.

Figure 8E:
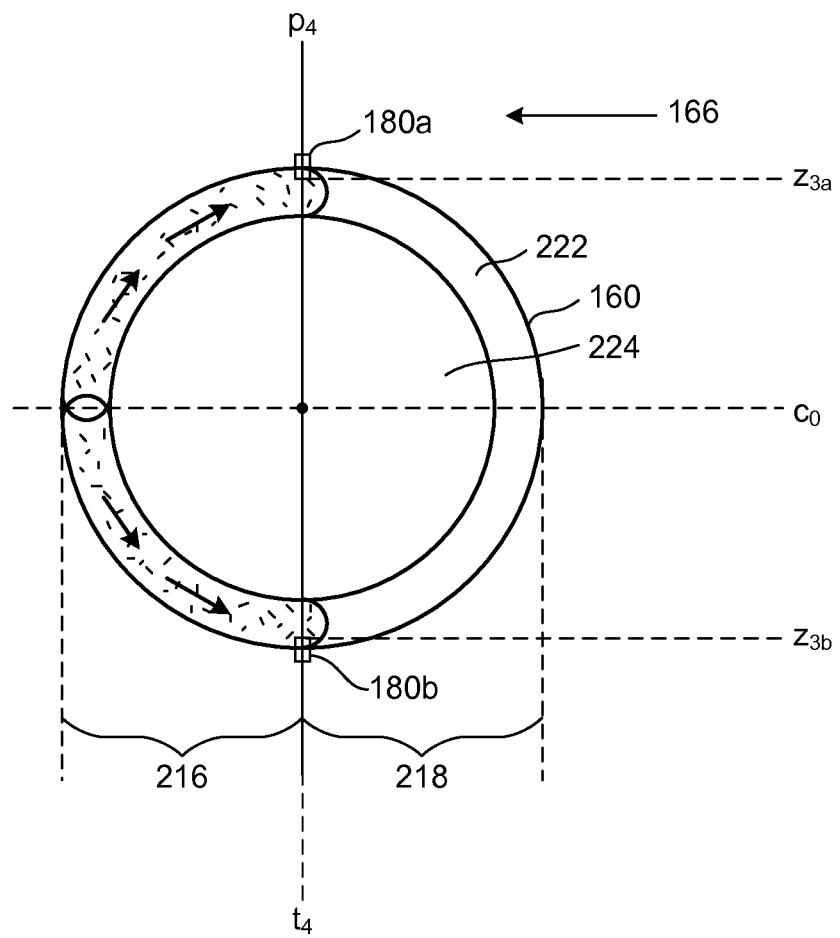
FIG. 8E is a top view of the substrate to illustrate dispensing of the pre-wetting fluid on the first half-annular portion.

FIG. 8E shows a top view of an embodiment of substrate 160 to illustrate dispensing of the pre-wetting fluid on edge region 222 in the half portion 216. The pre-wet controller 214 receives a signal from the position sensor 270 that the pre-wet dispensers 180 have reached the outer positions $z_3$. In response to receiving the signal, the pre-wet controller 214 sends a signal to the pre-wet dispense position controller 262 to control the drive 162 to stop driving the pre-wet dispensers 180. When the pre-wet dispensers 180 are at positions $z_3$, at least a portion of the pre-wet dispensers 180 is on top of surface 224.

In other embodiments, substrate 160 can be pre-wetted with the pre-wetting fluid that is dispensed from an arc of stationary pre-wet dispensers. For example, the stationary pre-wet dispensers can be placed at the positions $c_0$, $z_1$, $z_2$, and $z_3$ and a supply of the pre-wetting fluid to the stationary pre-wet dispensers is controlled by the pre-wet controller 214 based on a location of the carrier 150.

Figure 9A:
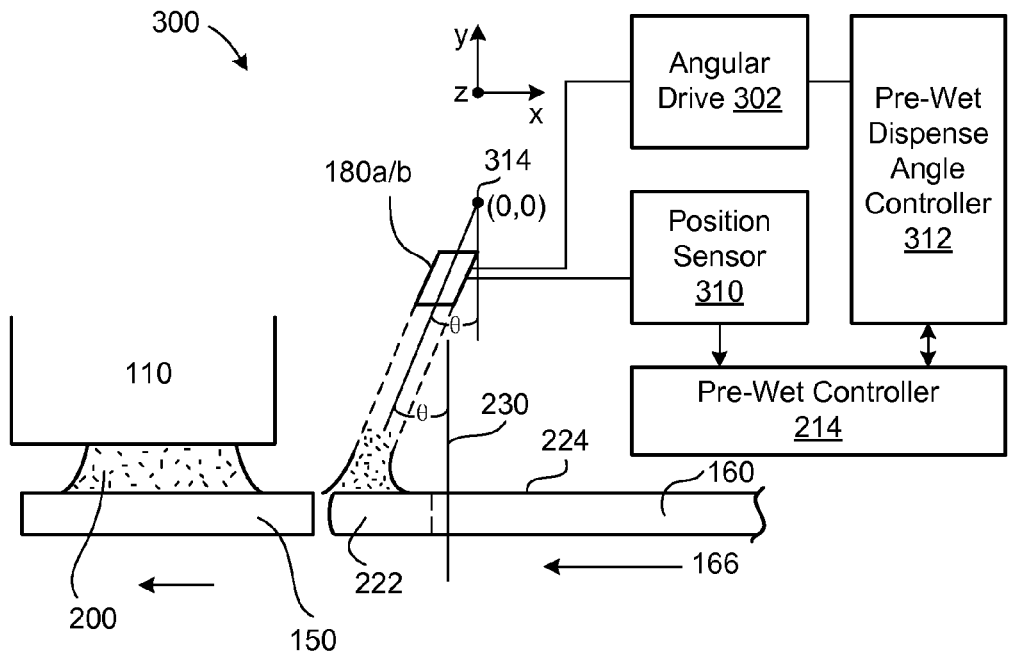
FIG. 9A is a schematic of a pre-wet and proximity head system used to drive the pre-wet dispensers angularly, in accordance with an example embodiment of the present invention.
Figure 9B:
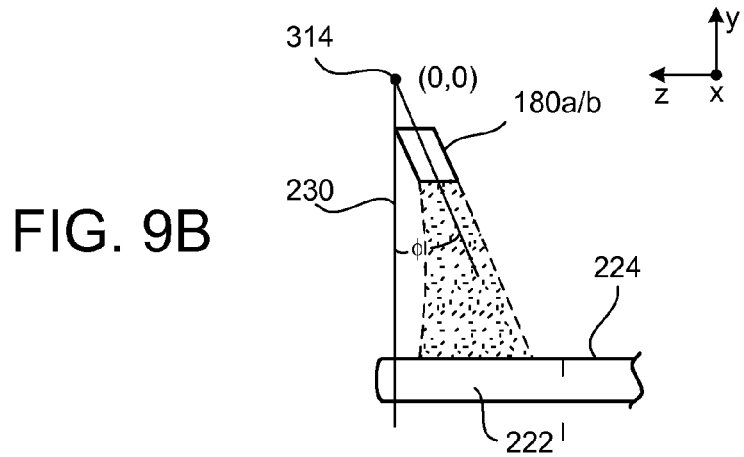
FIG. 9B is a view of the substrate to illustrate an angle with respect to a perpendicular from the surface, in accordance with an example embodiment of the present invention.

FIG. 9A is a schematic of an embodiment of a pre-wet and proximity head system system 300 used to drive pre-wet dispensers 180 angularly. A position sensor 310 senses a position of pre-wet dispenser 180a or 180b with respect to a co-ordinate system having origin (0,0) at a point 314. The position sensor 310 may be an optical sensor or an inductive sensor. In response to receiving a signal from the position sensor 310 indicating the position of the pre-wet dispenser 180a or 180b, the pre-wet controller 214 calculates angles θ (theta) and φ (phi) from the position to determine whether the pre-wet dispenser 180a or 180b has reached a corresponding pre-determined position, such as $z_{3a}$ or $z_{3b}$. The angle θ is formed with respect to a perpendicular line 230. The perpendicular line 230 is perpendicular to surface 224 and is parallel to a y-axis. The angle φ is illustrated in FIG. 9B and is also formed with respect to perpendicular line 230. Referring back to FIG. 9A, upon determining that the pre-wet dispenser 180a or 180b has reached the pre-determined position, the pre-wet controller 214 sends a signal to a pre-wet dispense angle controller 312 that sends a signal to angular drive 302 to stop driving the pre-wet dispenser 180a or 180b. On the other hand upon determining that the pre-wet dispenser 180a or 180b has not reached the pre-determined position, the pre-wet controller 214 avoids sending the signal and the angular drive 302 continues to drive the pre-wet dispenser 180a or 180b until the pre-determined position is reached.

Figure 9C:
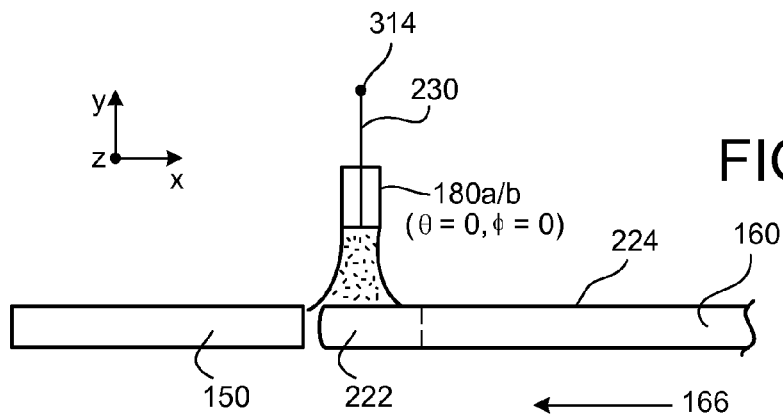
FIG. 9C is a view of the pre-wet dispenser in a position that is parallel to a y-axis, in accordance with an example embodiment of the present invention.

FIG. 9C shows an embodiment of pre-wet dispenser 180a or 180b having a position that is parallel to the y-axis so that the angles θ and φ are equal to 0. The pre-wet dispenser 180a or 180b points in a y-direction perpendicular to surface 224.

FIG. 10A shows a view of an embodiment of substrate 160 dispensed with an edge-directed flow of the pre-wetting fluid. The pre-wetting fluid is dispensed on a portion of edge region 222 to form a pre-wet meniscus 232. The pre-wet dispenser 180a or 180b forms an angle θ with the y-axis in an x-direction to allow the pre-wetting fluid to be directed in a direction 322. The direction 322 is towards the edge region 222 and also towards an edge 324 of substrate 160. The pre-wetting head 163 deposits a film of the pre-wetting fluid on the substrate 160 with the edge-directed flow to generate a pre-wet meniscus 232 on surface 224 within edge region 222. The bevel 328 is adjacent to edge 324 and remaining of surface 224, other than bevel 328, lacks a slope.

FIG. 10B shows a top view of an embodiment of the substrate 160 to illustrate a contact line 326 of the pre-wet meniscus 232. As the pre-wetting fluid is dispensed towards edge region 222 and towards the edge 324 with the edge-directed flow, the contact line 326 of the pre-wetting meniscus 232 advances towards the edge 324.

FIG. 10C shows a view of an embodiment of substrate 160 to illustrate dislodging of particles 250 from surface 224. The advancing contact line 326 may dislodge particles 250 on surface 224 so that a net lateral motion of the particles 250 is towards the edge 324.

Figure 10E:
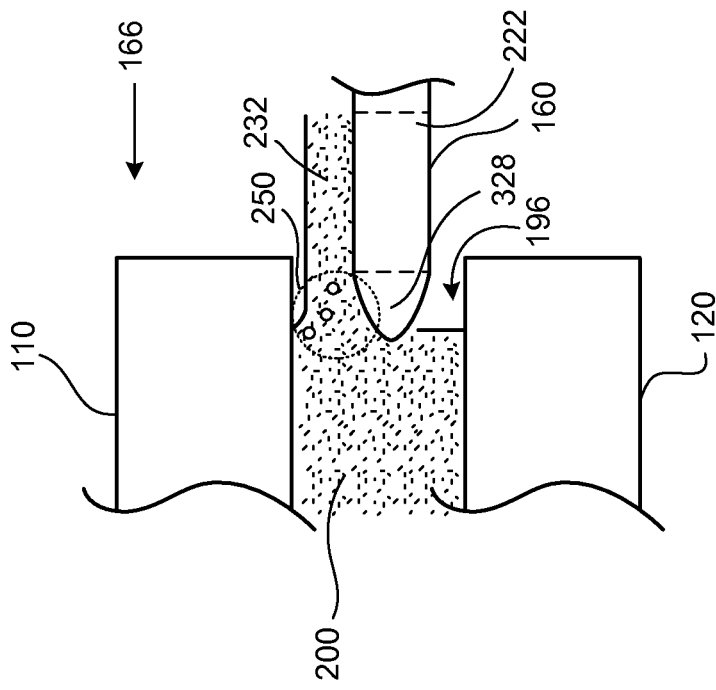
FIG. 10E is a view of the substrate as the pre-wet meniscus comes in contact with another meniscus, in accordance with an example embodiment of the present invention.
Figure 10D:
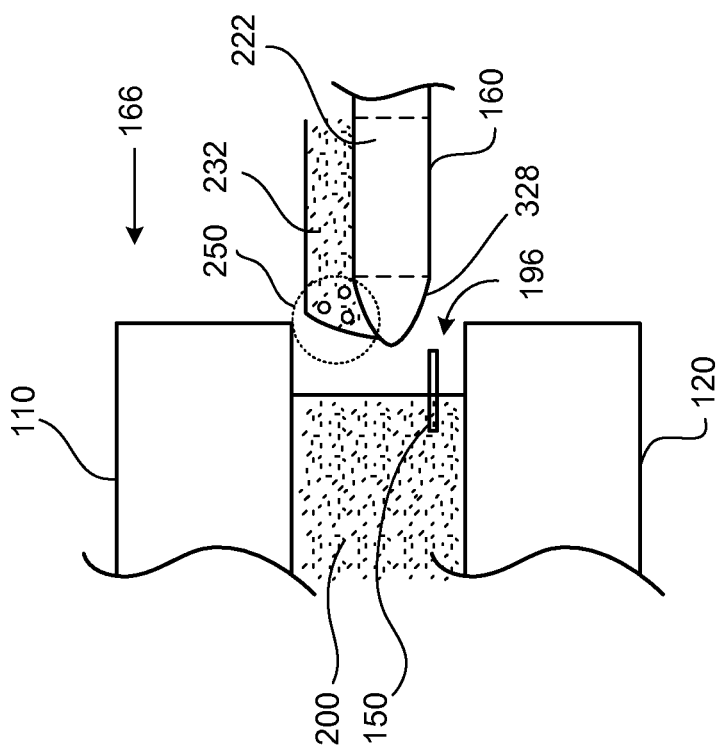
FIG. 10D is a view of the substrate as the substrate progresses towards a gap between the upper and lower proximity heads after dispensing of the pre-wetting fluid on the edge region, in accordance with an example embodiment of the present invention.

FIG. 10D shows a view of an embodiment of substrate 160 as the substrate progresses towards gap 196. The dislodged particles 250 proceed towards gap 196 to make contact with meniscus 200 as the carrier 150 progresses towards the gap 196.

FIG. 10E shows a view of an embodiment of substrate 160 as the pre-wet meniscus 232 comes in contact with meniscus 200. As the pre-wet meniscus 232 makes contact with the meniscus 200, the two menisci 200 and 232 merge to form a continuous film resulting in the disappearance of the menisci 200 and 232. The merging results in a disappearance of the contact line 326. The disappearance of the menisci 200 and 232 and the moving contact line 326 also takes away the re-circulation eddies which could have been present near the now absent contact line 326. As a result, the dislodged particles 250 remain on the bevel 328 of the substrate and are swept by the vacuum moving them away from the surface 224. Particles 250 are thus removed by the vacuum system 266 rather than re-depositing back onto the substrate 160. Even if the particles remain on the bevel 328, they cannot harm the substrate 160 or an electronic components associated with the substrate 160.

The present Application is related to the following U.S. patents, all of which are incorporated herein by reference in their entirety: U.S. Pat. No. 6,488,040, issued on Dec. 3, 2002 and titled, "Capillary Proximity Heads For Single Wafer Cleaning And Drying"; U.S. Pat. No. 7,198,055, issued on Apr. 3, 2007 and titled, "Meniscus, Vacuum, IPA Vapor, Drying Manifold"; U.S. Pat. No. 7,240,679, issued on Jul. 10, 2007, titled, "System For Substrate Processing With Meniscus, Vacuum, IPA Vapor, Drying Manifold;" U.S. Pat. No. 6,988,327, issued on Jan. 24, 2006, now expired, and titled, "Methods And Systems For Processing A Substrate Using A Dynamic Liquid Meniscus;" U.S. Pat. No. 7,513,262, which was issued on Jul. 4, 2009, and titled, "Substrate Meniscus Interface And Methods For Operation", and U.S. Pat. No. 7,234,477, issued on Apr. 7, 2009, and titled, "Method and Apparatus For Drying Semiconductor Wafer Surfaces Using a Plurality of Inlets And Outlets Held In Close Proximity To The Wafer Surfaces".

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

What is claimed is:

1. An apparatus for processing a substrate, comprising:
  a process chamber having a track;
  a carrier connected to the track for moving the substrate along a path;
  upper and lower proximity heads defined in the process chamber and positioned along the path, the upper and lower proximity heads having opposing faces that define a gap in which a meniscus of fluid is formed when in operation, the path for the carrier being defined along the gap between the opposing faces, the upper and lower proximity heads having a length that extends up to at least a diameter of the substrate;
  a first pre-wet dispenser and a second pre-wet dispenser disposed along side of the upper proximity head, the first and second pre-wet dispensers directed toward the path;
  a drive for moving each of the first and second pre-wet dispensers between a center position along the length of the upper proximity head and opposite outer positions defined near outer ends of the upper proximity head; and
  a pre-wet controller for causing the drive to move each of the first and second pre-wet dispensers based on a position of the carrier when moved under the first and second pre-wet dispensers.

2. The apparatus as claimed in claim 1, wherein the outer positions include a first outer position and a second outer position, the pre-wet controller for causing the drive to move the first pre-wet dispenser from the center position to the first outer position, and for causing the drive to move the second pre-wet dispenser from the center position to the second outer position.

3. The apparatus as claimed in claim 2, where the first and second pre-wet dispensers are used for dispensing a pre-wetting fluid, the substrate including a first half portion and a second half portion, the move of the first pre-wet dispenser includes a first move, the move of the second pre-wet dispenser includes a second move, and the pre-wet controller for causing the first and second moves during the dispensing of the pre-wetting fluid on an edge region of the first half portion.

4. The apparatus as claimed in claim 1, wherein the outer positions include a first outer position and a second outer position, the pre-wet controller for causing the drive to move the first pre-wet dispenser from the first outer position to the center position, and for causing the drive to move from the second outer position to the center position.

5. The apparatus as claimed in claim 4, wherein the first and second pre-wet dispensers are used for dispensing a pre-wetting fluid, the substrate including a first half portion and a second half portion, the move of the first pre-wet dispenser including a first move, the move of the second dispenser including a second move, and the pre-wet dispenser controller for causing the first and second moves during the dispensing of the pre-wetting fluid on the second half portion.

6. The apparatus as claimed in claim 1, wherein the substrate has a surface, the apparatus further comprising:
  a position sensor for sensing a position of the substrate; and
  an angular drive for driving the first and second pre-wet dispensers angularly with respect to a perpendicular line from the surface based on the position of the substrate.

* * * * *